United States Patent [19]

Guan et al.

[11] Patent Number: 5,753,563
[45] Date of Patent: May 19, 1998

[54] METHOD OF REMOVING PARTICLES BY ADHESIVE

[75] Inventors: Yong Yang Guan; Edward Hock Vui Lim, both of Singapore, Singapore

[73] Assignee: Chartered Semiconductor Manufacturing Ltd., Singapore, Singapore

[21] Appl. No.: 902,756

[22] Filed: Jul. 30, 1997

[51] Int. Cl.$^6$ ................................................. H01L 21/322
[52] U.S. Cl. ........................... 438/476; 438/906; 438/310
[58] Field of Search ........................... 438/476, 906, 438/310

[56] References Cited

U.S. PATENT DOCUMENTS

| | | | |
|---|---|---|---|
| 4,499,149 | 2/1985 | Berger | 428/447 |
| 4,768,081 | 8/1988 | Moeller | 357/72 |
| 4,982,469 | 1/1991 | Nishiwaki | 15/3 |
| 5,240,878 | 8/1993 | Fitzsimmons et al. | 438/670 |
| 5,316,975 | 5/1994 | Maeda | 438/906 |
| 5,397,401 | 3/1995 | Toma et al. | 136/259 |
| 5,435,876 | 7/1995 | Alfaro et al. | 156/247 |
| 5,483,717 | 1/1996 | Chikaki | 15/3 |
| 5,487,792 | 1/1996 | King et al. | 136/256 |
| 5,514,620 | 5/1996 | Aoki et al. | 438/906 |
| 5,529,957 | 6/1996 | Chan | 437/250 |

Primary Examiner—Charles L. Bowers, Jr.
Assistant Examiner—Lynne A. Gurley
Attorney, Agent, or Firm—George O. Saile; Stephen B. Ackerman

[57] ABSTRACT

The removal of particulate contaminants, such as dust particles, from the surface of a semiconductor wafer is achieved by pressing a soft adhesive layer against the wafer surface, leaving it in place for a short time and then removing it. The adhesive is brought to the wafer surface on a flexible medium which serves as a backing layer and to whose other side pressure can be applied. To remove the adhesive, the backing layer is peeled off, either by pulling on one end or by passing a sticky roller over it. The operation may be performed in air or under vacuum.

17 Claims, 2 Drawing Sheets

METHOD OF REMOVING PARTICLES BY ADHESIVE

BACKGROUND OF THE INVENTION

(1) Field of the Invention

The invention relates to the general field of semiconductor integrated circuits, more particularly to ways to remove surface contaminants.

(2) Description of the Prior Art

An ongoing problem associated with the manufacture of semiconductor integrated circuits is yield reduction as a result of the presence of particulate contaminants on the semiconductor surface. The most widely used methods for minimizing the incidence of such contaminants include rinsing, with or without ultrasonic agitation, and electrostatic repulsion.

Another approach to this problem is the direct removal of the particles by, in effect, plucking them off the surface. This is analogous to the use of a strip of sticky tape to remove lint from the surface of clothing. However, when applied to the semiconductor art, this approach introduces several concerns including possible surface contamination and possible surface damage. Nevertheless, several variations on the general method have been described in the prior art.

Chikaki (U.S. Pat. No. 5,483,717 January 1996) brings an adhesive layer of an acrylic emulsion into contact with the surface to be cleaned and then pulls it away. This is followed by a surface wash to remove bits of acrylic emulsion that may be left behind. The apparatus that is used is based on a roller whose surface is made up of the acrylic emulsion. Periodically, the emulsion is washed off and a fresh coating applied. In a second embodiment, a flexible strip is used to hold the emulsion so the strip gets pushed against the contaminated surface by a roller pushing from the other side.

Nishiwaki's invention (U.S. Pat. No. 4,982,469 January 1991) is directed towards cleaning a surface which is to be printed or painted on. He also uses a roller that has a sticky surface with the added feature that, on the side away from the surface that is being cleaned, a second roller removes dust particles that have been picked up by the first roller. This allows the first roller to be used for an extended period of time while the second roller is replaced at regular intervals.

Alfaro et al. (U.S. Pat. No. 5,435,876 July 1995) use a tape on which has been imprinted a pattern of adhesive that corresponds to the kerf between chip images on a wafer. The tape is aligned and then pressed against the wafer, thereby providing a protective covering to the wafer but touching it only between chips.

Chan (U.S. Pat. No. 5,529,957 June 1996) uses an adhesive tape as a means for accurately positioning discrete capacitors near the surface of an integrated circuit prior to permanently attaching them by soldering. After the soldering operation, the tape is removed and the areas that the tape contacted may then be cleaned.

SUMMARY OF THE INVENTION

It has been an object of the present invention to provide a method for removing particulate contamination from the surface of a semiconductor wafer.

An additional object has been that the method be capable of removing particles that have been found difficult to remove by other methods.

A still further object has been that the method do no damage and introduce no contamination to the wafer surface.

These objects have been achieved by pressing a soft adhesive layer against the wafer surface, leaving it in place for a short time and then removing it. The adhesive is brought to the wafer surface on a flexible medium which serves as a backing layer and to whose other side pressure can be applied. To remove the adhesive, the backing layer is peeled off, either by pulling on one end or by passing a sticky roller over it. Wafers are then rinsed in deionized water and spin dried to remove any traces of adhesive material that may have migrated to the wafer surface.

DESCRIPTION OF THE PREFERRED EMBODIMENTS

Figure 1:
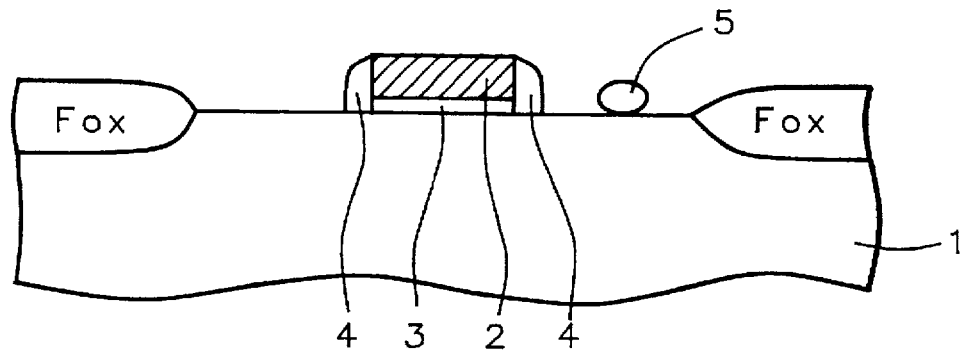
FIG. 1 shows a semiconductor wafer on whose surface lies a dust particle that needs to be removed.

FIG. 1 shows a schematic cross-section of a portion of a semiconductor integrated circuit. Polysilicon gate 2 is seen overlying silicon substrate 1 and separated from it by gate oxide layer 3. Oxide spacers 4 are seen on either side of the gate. Also shown are two regions of field oxide that are used for electrical isolation purposes. Lying on the surface of 1 is dust particle (or similar contaminant) 5.

The problem addressed by the present invention is how to remove 5 without in any way compromising the surface on which it had been resting. Since existing methods mentioned above are able to remove most of the particulate contamination, it is also clear that the present invention will need to be able to remove particles that have been left behind, either because they are particularly tenacious or because the existing methods cannot reach them.

Figure 2:
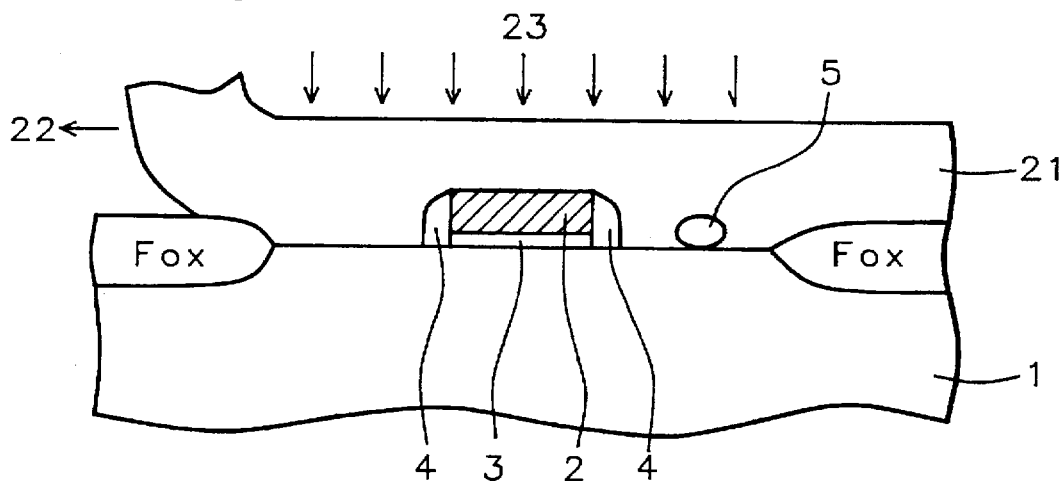
FIG. 2 shows how an adhesive layer applied to the surface of the wafer will cover and envelop the dust particle.

Referring now to FIG. 2 we show the first step of the method taught by the present invention. A layer of soft adhesive 21 is pressed against the upper surface of wafer 1. To make sure that layer 21 closely contours the surface of 1, including any particulate matter such as 5, downward pressure, schematically shown as arrows 23, is exerted on the top surface of layer 21. This pressure is typically between about 0.3 and 0.35 mPa (millipascal). A convenient method for applying the pressure is by means of a roller that does not stick to it or, in practice, to the backing layer that holds the adhesive (see below).

Examples of adhesives that are suitable for use in this application include methacrylate and 2 ethyl-hexyl-acrylate. An important characteristic shared by all of these is that they are all soft adhesives, having an adhesive strength between about 120 and 180 grams per 25 mm. length. The thickness of the adhesive layer is between about 9 and 11 microns. In practice layer 21 is not applied directly to the wafer surface. Rather it is carried to the wafer as a coating on the surface of a flexible medium or backing layer such as ethylene vinyl acetate (EVA), polyethylene (PE), polyethylene tetrephalate (PET), or oriented polypropylene (OPP). The presence of a backing layer of this sort also simplifies the problem of how to apply pressure to the adhesive layer. Once it is in place, convenient methods for applying pressure, such as by means of a roller that does not stick to the backing layer, can be used.

Once the layer 21 is in place it is allowed to remain there for a short period of time, typically about a minute, giving it time to settle around the particles that are to be removed.

Figure 3:
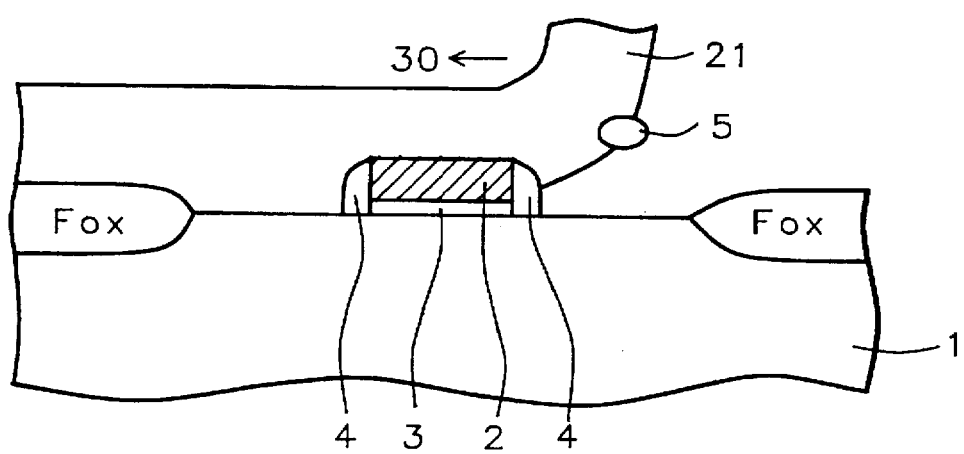
FIG. 3 shows how removal of the adhesive layer leads to removal of the dust particle as well.

FIG. 3 shows the next step which is the removal of layer 21 by a peeling action. As seen in the figure, this corresponds to application of a force in direction 30. This force cannot be applied directly to layer 21, as it is too soft. Instead, the removal is accomplished in one of two ways.

Figure 4:
FIGS. 4 and 5 illustrate two methods used for removing the adhesive layer.

The first peeling method is shown in FIG. 4. Force 40 is applied to flexible medium 41, which, while strong enough to remain intact, responds by lifting off the surface of 1, taking layer 21 with it.

Figure 5:
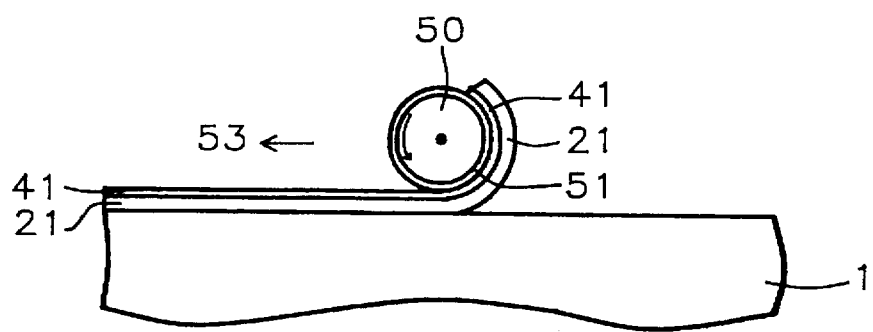

The second peeling method is shown in FIG. 5. Roller 50, which has a sticky surface 51 to which flexible medium 41 will readily adhere, is pressed against the top surface of 41, starting on the right hand side of wafer 1 (in this example). As it rolls to the left (direction 53) layers 41 and 51 stick to one another so 41 is peeled off the wafer surface, taking adhesive layer 21 (and entrapped dust particles) with it.

Although the method of the present invention, as described above, works well under normal conditions of atmospheric pressure, some additional improvement may be obtained by performing the entire operation under vacuum. Doing it this way guarantees that occasional gas bubbles will not get trapped around the particles that are to be removed. Should this happen, the adhesive will fail to contact the particle and it will stay behind when the adhesive is removed.

Whether or not processing is performed under vacuum, the final step in the process is for the wafers to be rinsed in deionized water and then spin dried to remove any traces of adhesive material that may have migrated to the wafer surface.

While the invention has been particularly shown and described with reference to the preferred embodiments thereof, it will be understood by those skilled in the art that various changes in form and details may be made without departing from the spirit and scope of the invention.

What is claimed is:

1. A method for removing dust particles from a surface of a semiconductor wafer, comprising the sequential steps of:
    a) providing a flexible substantially planar medium, having first and second sides, the first side being coated with a layer, having a thickness, of a soft adhesive material;
    b) pressing said adhesive layer against the entire wafer surface by applying a pressure to the second side, said pressure applying the entire adhesive layer to the entire wafer surface; and
    c) removing the entire adhesive layer from the surface of the wafer by pulling said flexible substantially planar medium away from the wafer surface.

2. The method of claim 1 wherein the adhesive material further comprises methacrylate or 2 ethyl-hexyl-acrylate.

3. The method of claim 1 wherein the flexible medium is selected from the group consisting of ethylene vinyl acetate, polyethylene, polyethylene tetrephalate, and oriented polypropylene.

4. The method of claim 1 further comprising waiting about one minute between steps b) and c).

5. The method of claim 1 wherein the pressure applied to the second side is between about 0.3 and 0.35 mPa.

6. The method of claim 1 wherein steps b) and c) are performed under vacuum.

7. The method of claim 1 wherein the adhesive strength of said adhesive layer is between about 120 and 180 grams per 25 mm. length.

8. The method of claim 1 wherein the thickness of the adhesive layer is between about 9 and 11 microns.

9. The method of claim 1 wherein the pressure is applied to the second side by means of a roller.

10. A method for removing dust particles from a surface of a semiconductor wafer, comprising the sequential steps of:
    a) providing a flexible substantially planar medium, having first and second sides, the first side being coated with a layer, having a thickness, of a soft adhesive material;
    b) providing a roller to which said second side will stick when brought into contact with the roller;
    c) pressing said adhesive layer against the entire wafer surface by applying a pressure to the second side said pressure applying the entire adhesive layer to the entire wafer surface; and
    d) removing the entire adhesive layer from the surface of the wafer by rolling the roller over said second side.

11. The method of claim 10 wherein the adhesive material further comprises methacrylate or 2 ethyl-hexyl-acrylate.

12. The method of claim 10 wherein the flexible medium is selected from the group consisting of ethylene vinyl acetate, polyethylene, polyethylene tetrephalate, and oriented polypropylene.

13. The method of claim 10 further comprising waiting about one minute between steps c) and d).

14. The method of claim 10 wherein the pressure applied to the second side is between about 0.3 and 0.35 mPa.

15. The method of claim 10 wherein steps c) and d) are performed under vacuum.

16. The method of claim 10 wherein the adhesive strength of said adhesive layer is between about 120 and 180 grams per 25 mm. length.

17. The method of claim 10 wherein the thickness of the adhesive layer is between about 9 and 11 microns.

* * * * *